United States Patent [19]

Anderson

[11] Patent Number: 4,751,198
[45] Date of Patent: * Jun. 14, 1988

[54] PROCESS FOR MAKING CONTACTS AND INTERCONNECTIONS USING DIRECT-REACTED SILICIDE

[75] Inventor: Dirk N. Anderson, Plano, Tex.

[73] Assignee: Texas Instruments Incorporated, Dallas, Tex.

[*] Notice: The portion of the term of this patent subsequent to May 20, 2003 has been disclaimed.

[21] Appl. No.: 774,675

[22] Filed: Sep. 11, 1985

[51] Int. Cl.[4] .................................. H01L 21/283
[52] U.S. Cl. .................................. 437/200; 437/201; 437/192; 148/DIG. 147
[58] Field of Search ............... 29/591, 590; 427/88, 427/93; 148/DIG. 147, DIG. 19; 357/71, 67; 437/200, 201, 202, 192, 193, 194

[56] References Cited

U.S. PATENT DOCUMENTS

| | | | |
|---|---|---|---|
| 3,740,835 | 6/1973 | Duncan | 29/578 |
| 3,918,149 | 11/1975 | Roberts | 29/580 |
| 4,180,596 | 12/1979 | Crowder et al. | 427/42 |
| 4,322,453 | 3/1982 | Miller | 427/89 |
| 4,398,341 | 8/1983 | Geipel, Jr. et al. | 29/578 |
| 4,507,853 | 4/1985 | McDavid | 29/591 |
| 4,545,116 | 10/1985 | Lau | 29/591 |

OTHER PUBLICATIONS

Ku, "Ohmic Contacts for Small, Shallow Structure Devices" IBM Technical Disc. Bull. vol. 22, No. 4, 9/1979.

Primary Examiner—Brian E. Hearn
Assistant Examiner—T. N. Quach
Attorney, Agent, or Firm—John G. Graham; Richard A. Bachand

[57] ABSTRACT

Metal contacts and interconnections for semiconductor integrated circuits are formed by a process using direct-reacted silicide to increase step or sidewall coverage. A thin layer of titanium or the like is deposited, extending into a contact hole, then polysilicon is deposited over the titanium coating the vertical sides of steps or apertures. A second thin layer of titanium is deposited, then a heat treatment forms silicide to create a titanium silicide layer, including conductive sidewalls or a plug. Metal contacts and interconnections then engage the direct-reacted silicide rather than relying upon step coverage.

9 Claims, 2 Drawing Sheets

PROCESS FOR MAKING CONTACTS AND INTERCONNECTIONS USING DIRECT-REACTED SILICIDE

RELATED CASES

This application discloses subject matter also disclosed in my prior copending application Ser. No. 659,610, now U.S. Pat. No. 4,589,169, filed Oct. 11, 1984, and in my copending application Ser. No. 774,764, filed herewith; both of said applications are assigned to Texas Instruments.

BACKGROUND OF THE INVENTION

This invention relates to semiconductor devices, and more particularly to metal contacts and interconnections for semiconductor integrated circuits.

In the manufacture of VLSI devices, a thin metal coating such as aluminum is deposited on a silicon substrate and patterned to create contacts and interconnections. Problems occur in thinning of the metal at near-vertical sidewalls of holes in thick insulator layers where the metallization pattern makes contact to silicon regions or to other layers such as polysilicon. Thinner metal at these sidewalls, or at similar steps along the surfaces results in higher resistance and a propensity for electro-migration failures. Heretofore, the steepness of the sidewalls has been minimized by a "reflow" process, but this necessitates undesirable high temperature operations and larger geometries.

In particular, the shrinking dimensions of VLSI devices such as the 1-Megabit or 4-Megabit dynamic RAMs, requiring one micron sized geometries or less, creates fundamental problems with forming good metallization to silicon contacts. The proximity to unrelated structures reaches a point where reflowing the insulating multilevel oxide, or sloping the contact edges in any other fashion, becomes unacceptable. However, sputtered aluminum is unacceptably thin on the edge of a vertical contact. Various methods have been tried to resolve this problem, including using lower resistance materials beneath the insulating oxide which enables the use of a thinner oxide layer and hence a smaller step, and the use of other metals which may have better step coverage. Problems with approaches such as these include failure after long term operation resulting from the thinner metallization on the small dimensioned contact sidewalls, however improved by the use of other metals.

It is the principal object of this invention to provide an improved process for making metal contacts for semiconductor integrated circuits. Another object is to provide improved semiconductor devices with metallization patterns, avoiding the problems of thinning at steps and contact apertures. A further object is to provide improved step coverage and lower resistance for metallization of semiconductor devices. Another object is to provide a method of making contacts that allow smaller pitch for the metal pattern (closer spacing between metal lines) due to smaller contact areas being allowed; thus higher density VLSI devices are possible.

SUMMARY OF THE INVENTION

In accordance with one embodiment of the invention, metal contacts and interconnections for semiconductor integrated circuits are formed by a process using direct-reacted silicide to increase step or sidewall coverge. A thin layer of titanium or the like is deposited, extending into a contact hole, then polysilicon is deposited over the titanium coating the vertical sides of steps or apertures. A second thin layer of titanium is deposited, then a heat treatment forms silicide to create a titanium silicide layer, including conductive sidewalls or a plug. Metal contacts and interconnections then engage the direct-reacted silicide rather than relying upon step coverage.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
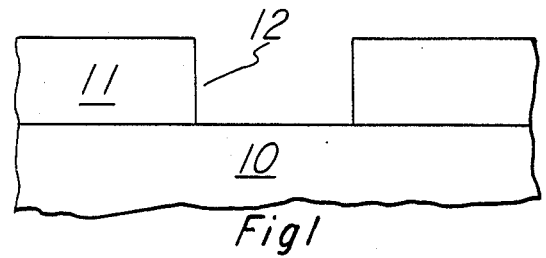
FIGS. 1-4 are greatly enlarged elevation views in section of a small part of a semiconductor chip having metal contacts made according to my copending application Ser. No. 659,610.

Referring to FIGS. 1-4, a method of forming a metal-to-silicon contact according to my copending application Ser. No. 659,610, is first described. A silicon substrate 10 has a silicon oxide layer 11 deposited on it as seen in FIG. 1, by any of several methods. There may be depositions of and patterning of other layers of polysilicon, refractory metals, or the like included in the process prior to the steps to be described. In any event, a vertical-walled hole 12 is formed in the oxide layer 11 by an anisotropic etch technique such as RIE. Typically, the hole would be about one micron in width, in an oxide layer of about one micron thickness, or more likely slightly less than one micron.

Figure 2:
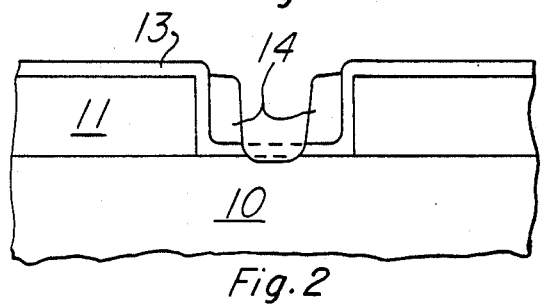

As seen in FIG. 2, a first layer 13 of titanium is deposited over the face of the silicon slice using a deposition method such as sputtering so that the titanium coats the sidewall, as well as the bottom of the hole 12. The thickness of the titanium is about 1000 Å on the top of the slice, although thinner in the hole. Next, a layer of polycrystalline silicon is deposited over the face of the slice, again by an isotropic deposition method such as low temperature, plasma-enhanced CVD, to leave a uniform coating of about 1500 to 3000 Å thickness over the sidewalls as well as the bottom of the hole. An anisotropic etch of the polysilicon leaves sidewall portions 14. Due to the fact that the titanium coating 13 in the bottom of the hole 12 is thinner than on the surface, the polysilicon etch may remove this titanium and some of the silicon face, as seen in the Figure. This etching through the titanium in the bottom of the hole is not necessary, but not harmful; if the etch is more selective it would not occur.

Figure 3:
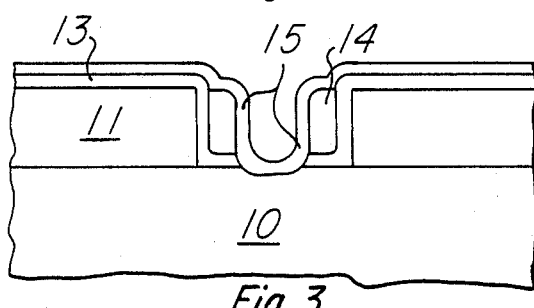

Turning now to FIG. 3, a second layer 15 of titanium is deposited by an isotropic method such as sputtering (to a thickness of about 1500 Å on top) so that it coats the sidewalls of the hole as well as the bottom. The slice is then heated to about 675° C. for one-half to one hour to form silicide wherever titanium is in contact with silicon (single crystal or poly). After the siliciding operation, the unwanted residue of titanium is removed by an etchant such as a solution of $H_2SO_4$ and $H_2O_2$ as taught by U.S. Pat. No. 4,545,116 issued Oct. 8, 1985 to Lau which removes other reacted titanium compounds (titanium nitride and oxide) from the silicon oxide 11 but not titanium silicide in the hole. The silicide formation will actually perform some physical redistribution of the forming layers, so this method does not require such good step coverage of the deposit films.

Figure 4:
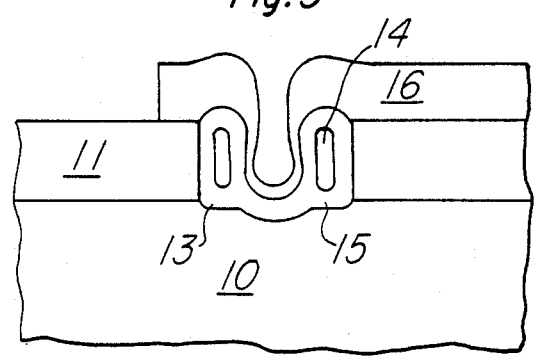

As seen in FIG. 4, a deposited and patterned metal layer 16 (such as aluminum) makes contact to the top area 17 of the titanium-silicide/polysilicon structure built up on the sidewalls of the hole 12. The thickness over the flat surface is much greater than in the hole. It does not matter that the step coverage is inadequate; if the metal 16 is thinned at the steps and does not make a low resistance connection to the bottom of the hole it is of no consequence because of the conductive walls.

The polysilicon layer may be deposited in such a way that the hole 12 is almost filled with a plug of polysilicon instead of merely the sidewalls 14. The titanium layer 15 would not then come into contact with the silicon substrate 10 within the hole 12. The silicided plug would function as before, however. This embodiment is illustrated in FIG. 5.

In a preferred embodiment of the invention, a layer of direct-reacted titanium silicide is formed across the entire top surface of the slice, before the metal 16 is deposited. The method for this embodiment is the same as set forth above through the deposition of the layer of polycrystalline silicon, i.e., just before the anisotropic etch step of FIG. 2. Instead of etching the layer of polycrystalline silicon, seen in FIG. 6, the layer 15 of titanium is deposited on top of it, so a sandwich layer of titanium 13, polysilicon 18, and titanium is created. The thicknesses and deposition methods for these layers are the same as above, the sandwich layer is subjected to the same heat treatment to direct-react the titanium and polysilicon, producing a conformal layer of titanium silicide 20 as such in FIG. 7. Due to the isotropic deposition of polysilicon 18 in the hole, and the physical redistribution of the forming layers occurring during the silicide reaction, this method does not rely upon good step coverage of the deposited films. After a clean-up etch to remove residue titanium compounds (other than titanium silicide) formed on the surface in the reaction, the metallization layer 16 is deposited as before, covering the entire top surface of the slice; there is also no need for good step coverage of this aluminum layer itself. Good electrical connection is made by the built-up sidewalls as before. After patterning the aluminum 16 and silicide 20, the resultant structure is seen in FIG. 8, which is the same as FIG. 4 except that the titanium silicide underlies all of the contact and interconnection areas, rather than just in the contact holes. Since titanium silicide etches in several of the same plasma etch processes commonly used to etch metals, the silicide layer 20 can be simply etched as part of a metallization stack.

Figure 5:
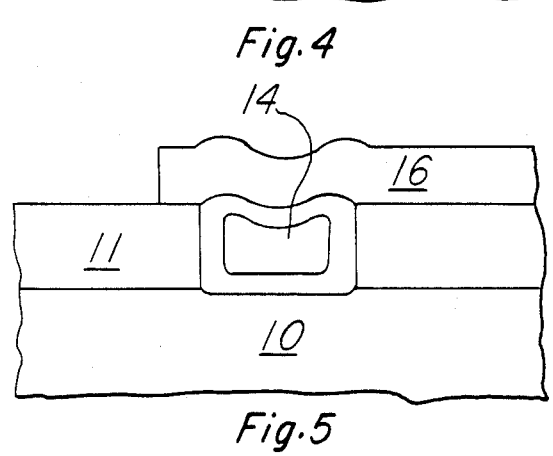
FIG. 5 is an elevation view in section, corresponding to FIG. 4, for another embodiment of the method of FIGS. 1-4.
Figure 6:
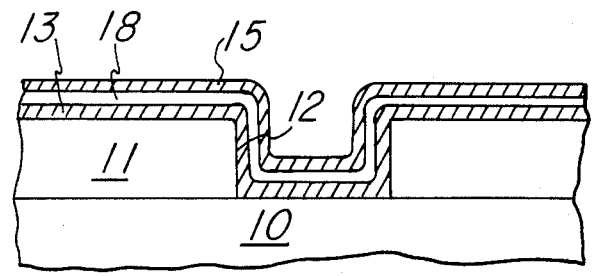
FIGS. 6-8 are elevation views of a semiconductor device corresponding to FIGS. 1-4, made according to the invention.
Figure 7:
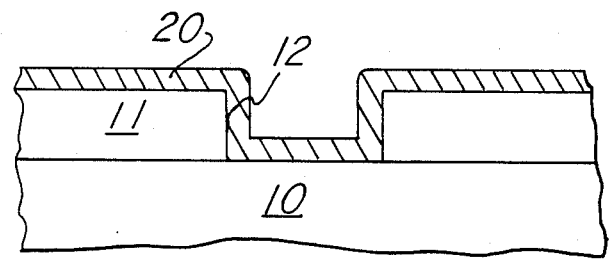
Figure 8:
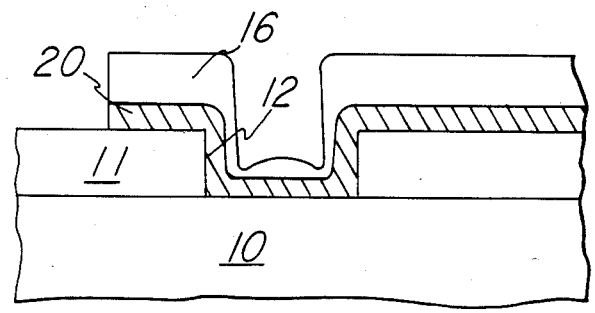

If the deposited polysilicon tends to fill the hole 12 as in FIG. 5, the method of the embodiment of FIGS. 6-8 is equally applicable.

While this invention has been described wtih reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making contact to a face of a semiconductor body through an aperture in an insulating layer on said face, comprising the steps of:
    (a) depositing a thin layer of refractory metal on said face to cover the semiconductor body within said aperture and also to cover the insulating layer and the sidewalls of the aperture,
    (b) depositing a layer of semiconductor material on the thin layer of refractory metal extending over said insulating layer and on the sidewalls,
    (c) depositing another thin layer of refractory metal on the layer of semiconductor material to extend continuously over the insulator and down the sidewall into the aperture,
    (d) reacting the thin layers of refractory metal with the semiconductor material, and
    (e) depositing a metal layer over said insulator to make contact to the reacted refractory metal and semiconductor material at said aperture.

2. A method according to claim 1 wherein said semiconductor material is silicon.

3. A method according to claim 2 wherein said layer of semiconductor material is polycrystalline silicon, and said insulating layer is silicon oxide.

4. A method according to claim 2 wherein said refractory metal is titanium.

5. A method of making a metal connection at a face of a semiconductor body, said connection extending over a step in an insulating layer on said face, comprising the steps of:
    (a) depositing a first layer of refractory metal on said face to cover the semiconductor body and to cover the insulating layer and the sidewall of the step,
    (b) depositing a layer of semiconductor material on the first layer of refractory metal over said face and said sidewall,
    (c) depositing a second layer of said refractory metal on the layer of semiconductor material to extend continuously across the step,
    (d) reacting the refractory metal layers with the semiconductor material, and
    (e) depositing a conductor on said face to engage the reacted refractory metal layers and semiconductor material at said step.

6. A method according to claim 5 wherein said semiconductor material is silicon.

7. A method according to claim 6 wherein said layer of semiconductor material is polycrystalline silicon, and said insulating layer is silicon oxide.

8. A method according to claim 7 wherein said refractory metal is titanium.

9. A method according to claim 5 wherein said refractory metal layers are titanium and said semiconductor material is silicon.

* * * * *